United States Patent
Ito

(10) Patent No.: US 7,855,572 B2
(45) Date of Patent: Dec. 21, 2010

(54) SEMICONDUCTOR INTEGRATED CIRCUIT DEVICE OPERATING FREQUENCY DETERMINING APPARATUS, DETERMINING METHOD AND COMPUTER-READABLE INFORMATION RECORDING MEDIUM

(75) Inventor: Noriyuki Ito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/662,338

(22) Filed: Apr. 12, 2010

(65) Prior Publication Data

US 2010/0194422 A1 Aug. 5, 2010

Related U.S. Application Data

(63) Continuation of application No. PCT/JP2007/070462, filed on Oct. 19, 2007.

(51) Int. Cl.
G01R 31/26 (2006.01)
(52) U.S. Cl. ...................................... 324/765
(58) Field of Classification Search ............... 324/158.1, 324/761–765; 438/14–18; 702/117, 84
See application file for complete search history.

(56) References Cited

U.S. PATENT DOCUMENTS 7,112,979 B2 * 9/2006 Arabi et al. .................. 324/765
7,131,041 B2 10/2006 Ozaki
7,290,183 B2 10/2007 Shimamura
7,528,622 B2 * 5/2009 Balog et al. .................. 324/765
2005/0182587 A1 8/2005 Sato et al.
2006/0203423 A1 9/2006 Lee et al.

FOREIGN PATENT DOCUMENTS

| JP | 2003-4818 | 1/2003 |
|---|---|---|
| JP | 2003-43109 | 2/2003 |
| JP | 2005-83895 | 3/2005 |
| JP | 2005-257654 | 9/2005 |
| JP | 2006-253651 | 9/2006 |

OTHER PUBLICATIONS

Noriyuki Ito et al., "Delay Defect Screening for a 2.16GHz SPARC64 Microprocessor", Fujitsu Limited, Fujitsu laboratory, 0-7803-9451-8/06, 2006, IEEE, 4A-1, pp. 342-347.
International Search Report for PCT/JP2007/070462, mailed Jan. 22, 2008.

* cited by examiner

Primary Examiner—Minh N Tang
Assistant Examiner—Trung Q Nguyen

(57) ABSTRACT

A variation in manufacturing total costs is obtained by using an excessive loss amount caused by unnecessarily discarding elemental semiconductor integrated circuits occurring as a result of a negative result being obtained in an elemental test but a positive result obtained from a device test, and a short loss amount caused by packaging elemental semiconductor integrated circuits for semiconductor integrated circuit devices that are discarded as a result of a positive result being obtained from the elemental test but a negative result being obtained from the device test. A new operating frequency is determined by using the variation in manufacturing total costs with respect to an operating frequency.

18 Claims, 7 Drawing Sheets

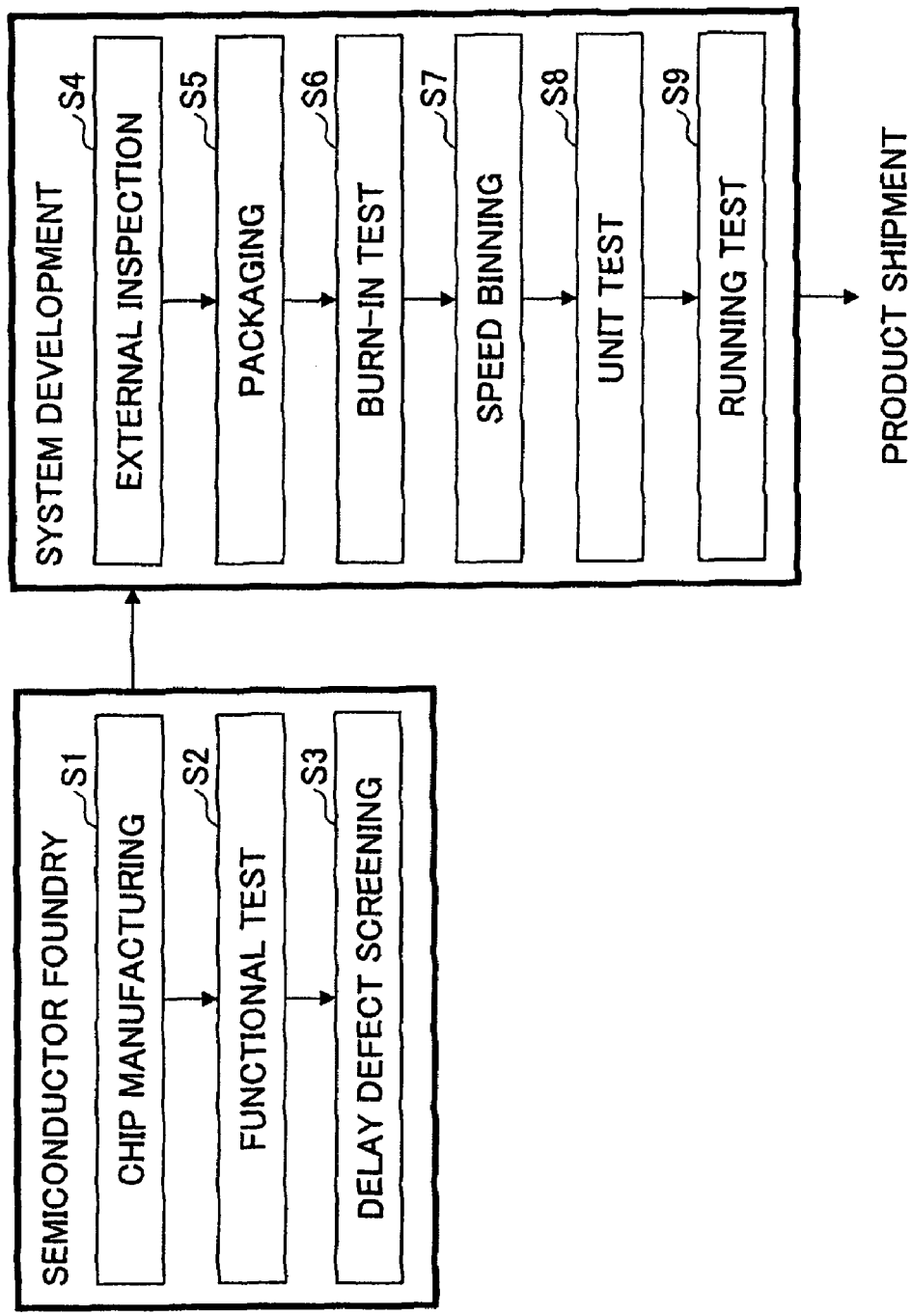

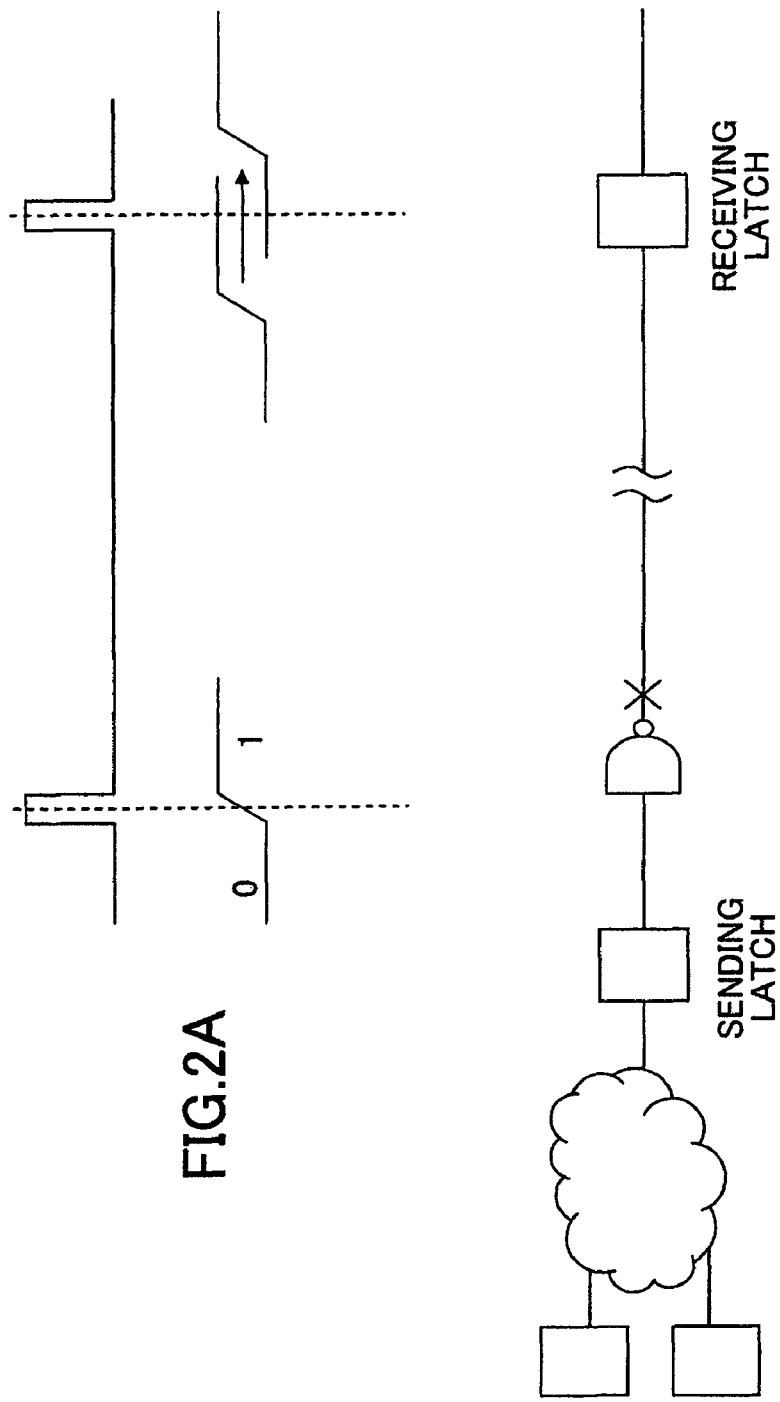

FIG.3

|  |  | DELAY TEST | |
|---|---|---|---|
|  |  | PASS | FAIL |
| PRODUCT TEST AFTER PACKAGING | PASS | CASE A: NO TRUE PASS LOSS EXISTS | CASE C: OVER-KILL EXISTS |
|  | FAIL | CASE B: UNDER-KILL EXISTS | CASE D: NO TRUE FAIL LOSS EXISTS |

FIG.4

|  | VALUE | FACTOR |
|---|---|---|
| COST INCREASE | $\sum_{i=A,B,C,D}(N_i \cdot DTC)$ | DELAY TEST (BARE CHIP OPERATION DELAY VERIFICATION) |
|  | $N_C \cdot UP$ | DISCARDING NON-DEFECTIVE PRODUCTS (OVER-KILL LOSS) |
| COST DECREASE | $N_D \cdot (PC+STC)$ | PACKAGING AND TESTING DEFECTIVE PRODUCTS (COSTS OF PROCESSES STARTING FROM PACKAGING OF DEFECTIVE PRODUCTS) |

# SEMICONDUCTOR INTEGRATED CIRCUIT DEVICE OPERATING FREQUENCY DETERMINING APPARATUS, DETERMINING METHOD AND COMPUTER-READABLE INFORMATION RECORDING MEDIUM

CROSS-REFERENCE TO RELATED APPLICATIONS

This application is a U.S. continuation application filed under 35 USC 111(a) claiming benefit under 35 USC 120 and 365(c) of PCT application JP2007/070462, filed Oct. 19, 2007. The foregoing application is hereby incorporated herein by reference.

FIELD

The embodiment discussed herein is directed to a semiconductor integrated circuit device operating frequency determining apparatus, determining method and a computer-readable information recording medium.

BACKGROUND

FIG. 1 illustrates a flow of manufacturing process of a semiconductor integrated circuit device (corresponding to FIG. 2 of a non-patent document 1, i.e., "Delay Defect Screening for a 2.16 GHz SPARC64 Microprocessor", Noriyuki Ito, Akira Kanuma, Daisuke Maruyama, Hitoshi Yamanaka, Tsuyoshi Mochizuki, Osamu Sugawara, Chihiro Endoh, Masahiro Yanagida, Takeshi Kono, Yutaka Isoda, Kazunobu Adachi, Takahisa Hiraidel, Shigeru Nagasawa, Yaroku Sugiyama, Eizo Ninoi, Fujitsu Limited, Fujitsu laboratory, 0-7803-9451-8/06, 2006, IEEE, 4A-1, pages 342-347)

As depicted in FIG. 1, generally speaking, the flow can be divided into a process of manufacturing and testing of an LSI chip (simply referred to as a "chip" or "bare chip" hereinafter) for a semiconductor integrated circuit device (S1-S3), and a process of packaging the chip, testing a thus-obtained semiconductor integrated circuit device package and shipping the semiconductor integrated circuit device package (S4-S9).

In the process of manufacturing and testing of the chip (S1-S3), a chip manufacturing process S1, a functional test S2 and a delay defect screening process S3 are carried out.

In the chip manufacturing test S1, a semiconductor integrated circuit device bare chip is manufactured. In the functional test S2, a basic function of the semiconductor integrated circuit device bare chip thus manufactured is then verified.

It is noted that "bare chip" indicates an LSI chip before packaging.

In the delay defect screening process S3, a so-called delay test is carried out on the semiconductor integrated circuit device bare chip for which the basic function has been verified in the functional test process S2. In the delay test, a test such as that which will be described with reference to FIGS. 2A and 2B (corresponding to FIG. 3 of the above-mentioned non-patent document 1) is carried out. Thus, it is verified whether an operating speed of semiconductor integrated circuit device bare chip meets a prescribed requirement.

In the process of packaging the above-mentioned semiconductor integrated circuit device bare chip, testing a thus-obtained semiconductor integrated circuit device package and shipping the semiconductor integrated circuit device package (S4-S9), an external inspection process S4, a packaging process S5, a burn-in process S6, a speed binning process S7, a unit test process S8, and running test process S9 are carried out.

In the external inspection process S4, an external appearance of the semiconductor integrated circuit device bare chip is inspected. In the packaging process S5, the semiconductor integrated circuit device bare chip having undergone the external inspection process S4 is mounted in a package. Thus, a semiconductor integrated circuit device package (also referred to as a semiconductor integrated circuit device) is manufactured.

In the burn-in test process S6, an environmental applicability verification test such as burn-in, aging and so forth is carried out on the semiconductor integrated circuit device package.

In the speed binning process S7, a selection is made from semiconductor integrated circuit device packages having undergone the burn-in test process S6. Here, for each of the semiconductor integrated circuit device packages, a suitable operating frequency is determined, and therewith, a selection is carried out from the semiconductor integrated circuit device packages.

In the unit test process S8, the thus-selected semiconductor integrated circuit device package is operated under actual operating conditions, and thus, it is verified that the semiconductor integrated circuit device package operates properly under the actual operating conditions.

In the running test process S9, for the semiconductor integrated circuit device package having undergone the unit test process S8, it is verified whether the semiconductor integrated circuit device package can properly carry out such an operation that will be carried out under a condition where the semiconductor integrated circuit device package will be installed in an apparatus as a final product (such as a server). Such a verification process is called "product test" hereinafter, and includes a "verification process for an operation delay after packaging" described later. After the semiconductor integrated circuit device package undergoes the running test process S9, the semiconductor integrated circuit device package is shipped.

Japanese Patent Application No. 2006-253651, and Japanese Laid-Open Patent Applications Nos. 2003-43109, 2005-83895 and 2005-257654 also discusses related arts.

SUMMARY

In an embodiment of the present invention, an operating frequency determining apparatus includes an elemental semiconductor test result input part, to which a result of an elemental semiconductor test performed on the elemental semiconductor integrated circuit device at an operating frequency by using an elemental semiconductor diagnosis test pattern is input; a semiconductor device test result input part, to which a result of a semiconductor device test performed on a semiconductor integrated circuit device obtained from packaging the elemental semiconductor integrated circuit at an operating frequency by using a semiconductor device diagnosis test pattern; an excessive discarding number/short discarding number calculating part configured to calculate an excessive discarding number of elemental semiconductor integrated circuits for which a negative result is obtained from the elemental semiconductor test but a positive result is obtained from the semiconductor device test, and calculate a short discarding number of elemental semiconductor integrated circuits for which a positive result is obtained from the elemental semiconductor test but a negative result is obtained from the semiconductor device test; a manufacturing total cost variation calculating part configured to calculate, by using the excessive discarding number and the short discarding number, a variation in manufacturing total costs, by using an excessive loss amount caused by unnecessarily discarding elemental semiconductor integrated circuits occurring as a result of a negative result being obtained in the elemental semiconductor test but a positive result being obtained from the semiconductor device test, and using a short loss amount caused by packaging elemental semiconductor integrated circuits for semiconductor integrated circuit devices that are discarded as a result of a positive result being obtained from the elemental semiconductor test but a negative result being obtained from the semiconductor device test; and an operating frequency determining part configured to determine a new operating frequency to be used in the elemental semiconductor test or the semiconductor device test, by using the variation in manufacturing total costs with respect to the operating frequency.

The object and advantages of the disclosure will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 illustrates one example of a semiconductor integrated circuit device manufacturing process;

FIGS. 2A and 2B illustrate one example of a delay test carried out in a delay defect screening process depicted in FIG. 1;

FIG. 3 illustrates a relationship between delay test results and after packaging product test results (corresponding to Table 1 of the non-patent document 1);

FIG. 4 illustrates one example of cost calculation in a semiconductor integrated circuit device bare chip operation delay verification frequency determining method in one embodiment of the present invention;

DESCRIPTION OF EMBODIMENT

Figure 5:
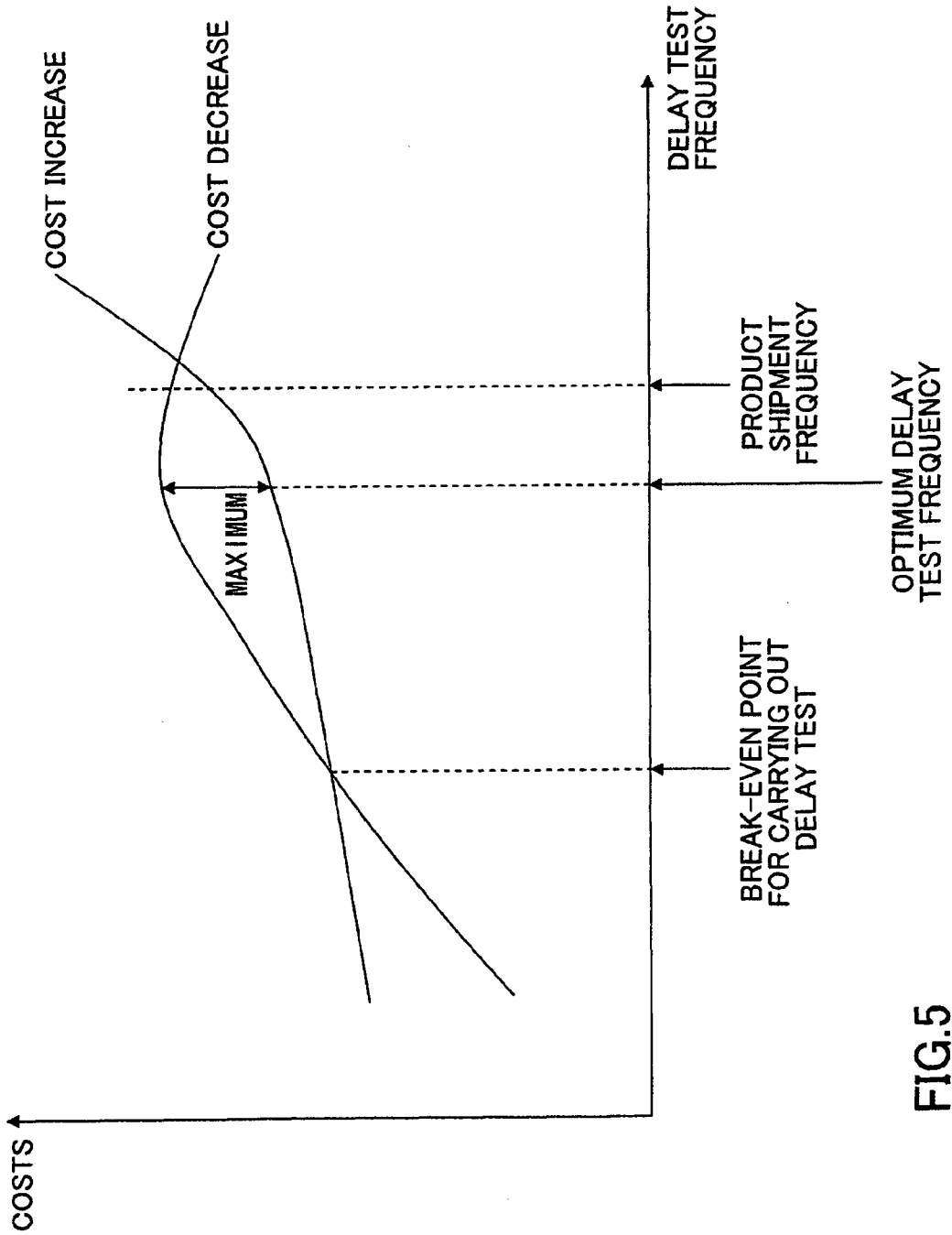
FIG. 5 illustrates a principle of finding an optimum frequency to be used for a delay test in the semiconductor integrated circuit device bare chip operation delay verification frequency determining method in one embodiment of the present invention.

A semiconductor integrated circuit device bare chip operation delay verification frequency determining method in one embodiment of the present invention will now be described. In the semiconductor integrated circuit device bare chip operation delay verification frequency determining method, a frequency of clock pulses to be used in a delay test carried out before packaging (in a bare chip state) on a semiconductor integrated circuit device bare chip is optimized.

FIGS. 2A and 2B illustrate a delay test carried out in a delayed defect screening process S3 depicted in FIG. 1.

A top waveform depicted in FIG. 2A depicts a waveform of clock pulses to be input to a semiconductor integrated circuit device bare chip in the delay test.

As the frequency of the clock pulses to be input to the semiconductor integrated circuit device bare chip, a frequency lower than and close to an operating frequency that is used in the same condition as that in which the semiconductor integrated circuit device will be mounted in a final product may be used.

A bottom waveform depicted in FIG. 2A depicts a state (left side) in which, in a latch circuit (sending latch circuit, or "sending latch" in the figure) included in the semiconductor integrated circuit device chip, a first test vector "0" input to the bare chip is latched, and then, a next test vector "1" is latched with a first clock pulse (left side).

Further, a bottom waveform depicted in FIG. 2A depicts a state (right side) in which, in a latch circuit (receiving latch circuit, or "receiving latch" in the figure) included in the bare chip and connected subsequent to the sending latch circuit, the first test vector "0" input to the bare chip is latched, and then, the next test vector "1" is latched with a second clock pulse (right side) in one case and the next test vector "1" is not latched with the second clock pulse (right side) in another case.

FIG. 2B depicts a part of a logic circuit included in the bare chip that is to undergo the delay test.

As depicted in FIG. 2B, a NAND circuit is connected for example, between the sending latch circuit and the receiving latch circuit, but no other sequential circuit such as a latch circuit is not inserted between the sending latch circuit and the receiving latch circuit. Therefore, from a logical viewpoint, when the sending latch circuit latches a test vector with a clock pulse, the test vector reaches the receiving latch circuit, which then latches the test vector with a subsequent clock pulse.

However, actually, because of a physical configuration of the semiconductor integrated circuit device chip, that is, because of a data transmission delay caused by wires between transistor devices included in the chip, and operation delays caused by the transistor devices themselves, for example, a data transmission delay may occur between the sending latch circuit and the receiving latch circuit.

Designing of semiconductor integrated circuit devices is carried out in consideration of such a data transmission delay caused by physical factors. That is, such a design requirement is given that, after the sending latch circuit latches a second test vector "1" with a first clock pulse, a corresponding rising up waveform sent from the sending latch circuit reaches the receiving latch circuit, where a delay time therebetween falls within a period of the clock pulses.

Therefore, a difference between the period of the clock pulses and the delay time between the sending latch circuit and the receiving latch circuit corresponds to a margin for the operation frequency.

As a result, as long as the chip for a semiconductor integrated circuit device is manufactured according to the above-mentioned design requirement, a signal latched by the sending latch circuit with a first clock pulse is then latched by the receiving latch circuit with a second clock pulse. That is, the semiconductor integrated circuit device chip carries out a proper logic operation.

The above-mentioned delay test is a test for verifying that the semiconductor integrated circuit device chip carries out a proper logic operation when the chip is driven by clock pulses of a predetermined operating frequency.

Then, when the semiconductor integrated circuit device chip does not carry out a proper logic operation in the delay test, the chip is discarded as a defect product.

A case is assumed that, the delay test (S3) is not carried out on the chip for semiconductor integrated circuit device before packaging (in a bare chip state), and the chip passing the functional test S2 is caused to directly undergo the processes starting from external inspection S4. In this case, a defect, if any, of the chip is found out first in the running test process S9 before chip shipment. In more particular, a defect may be found out in a product test in which the chip is verified for such an operation that will be carried out in the same condition as that in which the chip will be installed in a final product (e.g. server or such). In such a case, for the chip having the defect, the processes S4 through S9 are useless, since the chip having the defect is consequently discarded. The processes S4 through S9 are not carried out in a case where the chip is discarded immediately after the defect is found in the delay defect screening process S3. Therefore, by carrying out the delay defect screening process S3 and discarding a defective chip, if any, immediately after that, it is possible to avoid carrying out the processes S4 through S9 uselessly for the defective chip.

However, the following case may be considered in a case where an operating frequency of the clock pulses is too high in the delay defect screening process S3.

That is, there may be case where, even when the semiconductor integrated circuit device bare chip is judged as defective for delay in the delay defect screening process S3, the same chip is judged as non-defective for delay in the running test process S9 after undergoing the processes S4 through S9 without being discarded immediately after the delay defect screening test S3.

For the chip for which it is judged as defective for delay in the delay defect screening process S3, but it is judged non-defective for delay in the running test process S9, this means that the chip is one preferably be judged as non-defective for delay. Therefore, by discarding the chip immediately after the delay defect screening process S3, the bare chip that are preferably to be judged as non-defective for delay is discarded, and manufacturing costs for the chip are uselessly and unnecessarily consumed (corresponding to "over-kill" described later).

In a semiconductor integrated circuit device bare chip operation delay verification frequency determining apparatus and determining method according to an embodiment of the present invention, in consideration of the above-mentioned point, a frequency (bare chip operation delay verification frequency) to be used in a delay test (bare chip operation delay verification process) before packaging (in a bare chip state) carried out on a semiconductor integrated circuit device bare chip is optimized. Thereby, the costs required for a semiconductor integrated circuit device manufacturing process can be effectively reduced.

According to the embodiment of the present invention, an increase/decrease in a total manufacturing costs with respect to an operation frequency used for a bare chip test (delay test, S3) is obtained, and by using it, an operation frequency used in the bare chip test (S3) or a production test (S9) is determined.

It is considered that, as an operating frequency (of clock pulses) used in a bare chip test (delay test of elemental semiconductor test) is increased and is made to approach an operating frequency of an operation that will be carried out when the chip will be installed in a final product, percent defective of chips for semiconductor integrated circuit devices may increase. Also, cases where defective judgment corresponding to the above-mentioned over-kill may increase. The reasons therefor are as follows:

As the frequency of the clock pulses is increased, circuit parts that control frequencies in a semiconductor integrated circuit device chip are tested more severely. For example, it is clear that percentage defective increases when a test is carried out with a frequency that is higher than a frequency assumed for a final product, which is a frequency that is a target in designing of the semiconductor integrated circuit device.

Among the above-mentioned circuit parts that control frequencies in a semiconductor integrated circuit device chip, a specific circuit part may be tested severely by using test data that actually operates a circuit included in the chip. There may be a case where a degree of the severity may be different from one in the same condition as that in which the semiconductor integrated circuit device will be installed in a final product.

Further, test conditions such as an ambient temperature, a power supply voltage and so forth used when a semiconductor integrated circuit device bare chip is tested may be different from those in the same condition as that in which the semiconductor untargeted circuit device will be installed in a final product (server or such). Therefore, there may be a case where, test conditions may be more severe in a case where the bare chip is tested for an operation with an operating frequency than a case where the semiconductor integrated circuit device is installed in the final product (e.g. server or such).

According to the embodiment of the present invention, as mentioned above, an increase/decrease in a total manufacturing costs with respect to an operation frequency used for a bare chip test (delay test, S3) is obtained, and by using it, an operation frequency used in the bare chip test (S3) or a production test (S9) is determined. Thereby, the costs required for a semiconductor integrated circuit device manufacturing process can be effectively reduced.

Below, an embodiment of the present invention will be described with reference to figures.

First, a principle of a semiconductor integrated circuit device bare chip operation delay verification frequency determining method in the embodiment of the present invention will be described.

The above-mentioned delay test is a test for finding a delay defect of a semiconductor integrated circuit device bare chip. A frequency (bare chip operation delay verification frequency, simply referred to as "delay test frequency", hereinafter) of the clock pulses used in the delay test may be preferably an operating frequency (after packaging operation delay verification frequency, corresponding to a target operation frequency of the semiconductor integrated circuit device) of an operation that will be carried out when the semiconductor integrated circuit device will be installed in a final product (e.g. server or such).

However, in a case where the above-mentioned target operating frequency is used as the delay test frequency, a situation may occur in which, the semiconductor integrated circuit device chip that will be non-defective in a state in which the chip is installed in a final product (e.g. server or such) may be judged as defective for delay in the delay test, and thus, discarded.

Conversely, in a case where the delay test frequency is too low with respect to the target operating frequency, a delay defect which occurs in the same condition as that in which the chip will be installed in a final product (e.g. server or such) cannot be found out in the delay test before packaging (in a bare chip state).

Therefor, in the semiconductor integrated circuit device bare chip operation delay verification frequency determining method according to the embodiment of the present invention, all the costs are considered, and the delay test frequency that results in the largest reduction in the total costs is obtained.

It is noted that "delay defect" means a defect concerning a delay of an operating speed of a semiconductor integrated circuit device chip for which a basic function is non-defective.

Such a delay defect may occur because of an increase in an operation delay in a logic circuit caused by an increase in resistance caused by opening of a wire or a via, or an increase in capacitance caused by bridging a short circuit between wires or such.

Such a delay defect may result in a critical failure in a processor for which high performance is required. Thus, it is preferable to detect a delay defect as early as possible after a semiconductor integrated circuit device chip is manufactured.

The above-mentioned delay test for the purpose of detecting a delay defect is carried out, as described above with reference to FIGS. 2A and 2B, by using clock pulses having a frequency that is equal to or close to a target operating frequency of a semiconductor integrated circuit device.

As described above with reference to FIG. 1, delay defect chip screening is carried out by carrying out the delay test in a semiconductor integrated circuit device manufacturing process. However, according to a semiconductor integrated circuit device bare chip operation delay verification frequency determination method in one embodiment of the present invention, correlation is obtained between a result of detecting a delay defect for a semiconductor integrated circuit device bare chip, and a result of detecting a delay defect occurring in a product test carried out after packaging of the chip regardless of whether the bare chip is defective in the delay test.

That is, according to the semiconductor integrated circuit device bare chip operation delay verification frequency determining method in the embodiment of the present invention, as described above with reference to FIG. 1, the semiconductor integrated circuit device manufacturing process S1 through S9 is carried out. However, there, any products that are determined as being defective in the delay test are not discarded, and processes starting from the process S4 are carried out after packaging (in a packaged state). As mentioned above, according to the semiconductor integrated circuit device bare chip operation delay verification frequency determining method in the embodiment of the present invention, correlation is obtained between a result of detecting a delay defect for a semiconductor integrated circuit device bare chip before packaging (in a bare chip state), and a result of detecting a delay defect occurring in a product test carried out after packaging of the bare chip, regardless of whether the bare chip is defective.

After the correlation is thus obtained, it is determined which frequency is optimum to be used as a delay test frequency of clock pulses.

Then, after obtaining the optimum delay test frequency, the semiconductor integrated circuit device manufacturing process S1 through S9 such as that depicted in FIG. 1 is carried out. The delay test then using the optimum delay test frequency is then carried out in the delay defect screening S3.

The semiconductor integrated circuit device manufacturing process in this case can be the same as the semiconductor integrated circuit device manufacturing process in the related art except that the delay test is carried out in the delay defect screening process S3 at the optimum delay test frequency.

Specific contents of the semiconductor integrated circuit device bare chip operation delay verification frequency determining method in the embodiment of the present invention will now be described.

FIG. 3 depicts a combination of delay test results for semiconductor integrated circuit device bare chips before packaging (in a bare chip state) and results of whether a delay defect occurs in the product test after packaging (in a packaged state).

A case "A" depicted in FIG. 3 is a case where a semiconductor integrated circuit device bare chip is judged as non-defective for delay in the delay test carried out in a bare chip states, and also is judged as non-defective for delay in the product test after packaging of the chip (in a packaged state).

The number of semiconductor integrated circuit device chips belonging to the case "A" being large means that the number of semiconductor integrated circuit device chips that can be shipped after packaging (in a packaged state) is large.

Next, a case "B" depicted in FIG. 3 is a case where a semiconductor integrated circuit device bare chip is judged as non-defective for delay in the delay test carried out in a bare chip state, but is judged as defective for delay in the product test after packaging (in a packaged state) (referred to as "under-kill").

In the case "B", since a defect is found after packaging (in a packaged state), the costs required for processes starting from packaging become fruitless.

Next, a case "C" is called "over-kill", and in the case "C", a semiconductor integrated circuit device bare chip is judged as defective for delay in the delay test carried out in a bare chip state, but is judged as non-defective for delay in the product test after packaging.

In the case "C", when all the bare chips judged as defective for delay in the delay test are discarded, bare chips that will be judged as non-defective for delay in the product test are also discarded. Thus, some bare chips that can be shipped as non-defective products are unnecessarily discarded.

Finally, a case "D" is a case where a semiconductor integrated circuit device bare chip is judged as defective for delay in the delay test carried out in a bare chip state, and is also judged as defective for delay in the product test after packaging of the bare chip (in a packaged state). In the case "D", by discarding all the bare chips that are judged as defective for delay in the delay test, it is possible to avoid unnecessary cost consumption for processes starting from packaging that would occur otherwise.

An ideal state when the delay test of bare chips is carried out in the delay defect screening process is such that the number of semiconductor integrated circuit device chips belonging to the cases "B" and "C" are 0.

That is, the state in which the number of semiconductor integrated circuit device chips belonging to the cases "B" and "C" are 0 means a state in which all the semiconductor integrated circuit device chips that are judged as non-defective for delay in the product test (included in the running test S9 of FIG. 1) after packaging are also judged as non-defective for delay in the delay test carried out on the bare chips before packaging (in a bare chip state). That is, over-kill (case "C") does not occur. Further, all the semiconductor integrated circuit device chips that are judged as defective for delay in the product test after packaging are judged as defective for delay also in the delay test carried out in a bare chip state before packaging (in a bare chip state). That is, under-kill (case "B") does not occur either.

In a case where the case B (under-kill) does not occur, it is possible to avoid unnecessarily carrying out packaging and the product test on bare chips that will be judged as defective for delay in the product test.

Further, in a case where the case "C" (over-kill) does not occur, it is possible to avoid discarding semiconductor integrated circuit device bare chips that can be shipped as being judged as non-defective products after packaging, because the chips were judged defective for delay in the delay test before packaging (in a bare chip state).

The under-kill (case "B") probably occurs because test coverage for critical paths (i.e., the time required for signal propagation is longest which restricts an operation of a circuit) is narrow, or the delay test frequency in the delay test is low.

The over-kill (case "C") occurs probably because paths which may not be tested in consideration of operations of basic functions required for logic circuits of a semiconductor integrated circuit device are tested in the delay test before packaging (in a bare chip state), for example.

It is noted that the above-mentioned paths which may not be tested in consideration of operations of basic functions may include, for example, a path that is not activated by any command strings of a microprocessor in a case where a semiconductor integrated circuit device is shipped as a product of the microprocessor, or a path for which a fault cannot be observed from a observation point.

When the delay test is actually carried out, so-called at-speed clock pulses are used, which have a frequency that is equal to or close to a target operating frequency of a semiconductor integrated circuit device.

Depending on a specific value of a frequency of the at-speed clock pulses (i.e., the delay test frequency), a ratio of the numbers of semiconductor integrated circuit device chips classified into the above-mentioned cases A, B, C and D changes.

Generally speaking, as the frequency of the clock pulses used in the delay test (i.e., the delay test frequency) increases, the number of semiconductor integrated circuit device chips belonging to the cases A and B decrease and those belonging to the cases C and D increase.

In a case where the delay test is carried out in screening, all the bare chips judged as defective for delay are discarded. Therefore, the delay test may be carried out in screening in a case where, by carrying out the delay test in screening, manufacturing costs decrease. It is noted that the manufacturing costs indicate all the costs required for all the processes S1 through S9 described above with reference to FIG. 1 including semiconductor integrated circuit device bare chip manufacturing, packaging and shipping (including tests and inspections).

In the description below, $N_A$, $N_B$, $N_C$ and $N_D$ denote the numbers of chips belonging to the cases A, B, C and D, respectively. Hereinafter, $N_C$ will be referred to as an over-kill number, and $N_B$ will be referred to as an under-kill number. $N_A+N_B+N_C+N_D=m$, and m denotes a positive integer.

Further, UP denotes a chip unit cost of a semiconductor integrated circuit device bare chip, PC denotes costs required for packaging a semiconductor integrated circuit device bare chip, STC denotes system test costs required for a system test carried out for detecting any delay defect after packaging of a semiconductor integrated circuit device bare chip (in a packaged state), and DTC denotes costs required for the delay test for a semiconductor integrated circuit device bare chip.

FIG. 4 factors of manufacturing costs (hereinafter referred to as "cost increase") that increase and factors (hereinafter referred to as "cost decrease") that decrease. These factors are obtained from comparing a case where the delay test of bare chips is carried out for screening before packaging (in a bare chip state), and a case where, without carrying out the delay test for screening before packaging (in a bare chip state), bare chips that meet the other requirements undergo packaging and the system test is carried out.

From the contents of FIG. 4, a cost decrease amount $\Delta CR$ obtained from carrying out the delay test for screening before packaging (in a bare chip state) is calculated by the following formula (1):

$$\Delta CR = N_D \cdot (PC + STC) - N_C \cdot UP - \sum_{i=A,B,C,D} N_i \cdot DTC \quad (1)$$

In FIG. 4, "cost increase" means factors of manufacturing costs that increase in a first case in comparison to a second case. The first case is where the delay test is carried out for screening on semiconductor integrated circuit device bare chips before packaging (in a bare chip state). The second case is where, the delay test is not carried out for screening before packaging (in a bare chip state), bare chips that meet the other requirements undergo packaging, and then, the system test. The factors that increase ("cost increase") include costs required for carrying out the delay test on each of semiconductor integrated circuit device bare chips belonging to all the cases A, B, C and D ("delay test (bare chip operation delay verification)" in FIG. 4), and a loss occurring because bare chips belonging to the case C are discarded since they are judged as defective for delay in the delay test, although they can be shipped as non-defective products ("discarding non-defective products (over-kill loss)" in FIG. 4.

Conversely, the factors of manufacturing costs that decrease ("cost decrease" in FIG. 4) in the first case in comparison to the second case include costs required for carrying out processes staring from packaging on semiconductor integrated circuit device bare chips belonging to the case D, which will be judged as defective for delay in the system test (product test). These costs could be saved if the delay test were carried out before packaging, the bare chips were judged as defective for delay and were discarded before packaging (in a bare chip state) ("packaging and testing defective products (costs of processes starting from packaging of defective products)" in FIG. 4).

Correspondence relationship between the above-mentioned formula (1) and FIG. 4 is as follows:

The first term on the right side of the formula (1) corresponds to the costs of the bottom field of FIG. 4 (packaging and testing defective products);

the second term on the right side of the formula (1) corresponds to the costs of the middle field of FIG. 4 (over-kill loss); and the third term on the right side of the formula (1) corresponds to the costs of the top field of FIG. 4 (delay test (bare chip operation delay verification)).

That is, according to the formula (1), the above-mentioned $\Delta CR$ (bare chip operation delay verification reduction amount) is obtained from subtracting the costs of the over-kill loss and the costs of the bare chip operation delay verification from the costs of the packaging and testing defective products.

Further, in a case where $\Delta CR$ is larger than zero, screening by means of the delay test carried out on a semiconductor integrated circuit device bare chip before packaging (in a bare chip state) is meaningful.

This is because, a case where ΔCR is smaller than zero is a case where costs that increase ("cost increase") from carrying out screening by means of the delay test on a semiconductor integrated circuit device bare chip before packaging is larger than costs that decrease. That is, in total, a loss is caused.

Whether ΔCR is larger than zero depends on a capability of detecting a delay defect in the delay test carried out on a semiconductor integrated circuit device bare chip before packaging (in a bare chip state) and a frequency of at-speed clock pulses (delay test frequency).

It is advantageous to determine the delay test frequency at which ΔCR becomes maximum assuming that the capability of detecting a delay defect in the delay test carried out on a bare chip before packaging is constant, and carry out the delay test at the thus-determined delay test frequency on a bare chip before packaging.

In order to seek the delay test frequency at which ΔCR becomes maximum, the delay test of the same contents is carried out on each chip of a product group of semiconductor integrated circuit device bare chips manufactured according to the same specification before packaging by using clock pulses of n frequencies that are different each time as the delay test frequencies in sequence, and then, the bare chips undergo packaging, and the product test, according to the embodiment of the present invention. That is, the series of processes S1 through S9 of FIG. 1 are carried out on the product group of semiconductor integrated circuit device bare chips, data of ΔCR is obtained according to the above-mentioned formula (1), and is stored. Then, based on the stored data of ΔCR, the delay test frequency at which ΔCR becomes maximum is determined.

More specifically, frequencies $f_1$ through $f_n$ as candidates for the delay test frequency are used and the delay test is carried out on each chip of a product group of a predetermined number of semiconductor integrated circuit device bare chips manufactured according to the same specification, and then, packaging and the product test are carried out thereon. That is, the processes S1 through S9 of FIG. 1 are carried out, data of ΔCR is obtained according to the above-mentioned formula (1), and is stored. That is, $\Delta CR_1$ through $\Delta CR_n$ are obtained for the candidate frequencies $f_1$ through $f_n$ for the delay test frequency, respectively, and is stored.

Then, based on the thus-stored data $\Delta CR_1$ through $\Delta CR_n$, n−1 frequencies for which the data ΔCR is larger are selected from the n frequencies $f_1$ through $f_n$. That is, a frequency for which the data ΔCR is smallest is removed, and the remaining n−1 frequencies are obtained. Then, to the n−1 frequencies (candidates), a new candidate frequency is added so that new n candidate frequencies are finally obtained. Then, the new n frequencies as candidates for the delay test frequency are used and the delay test of the same contents is carried out on each chip of a new product group of a predetermined number of semiconductor integrated circuit device bare chips manufactured according to the same specification, and then, packaging and the product test are carried out thereon. That is, the processes S1 through S9 of FIG. 1 are carried out, data of ΔCR is obtained according to the above-mentioned formula (1), and is stored.

Further, calculating $\Delta CR_1$ through $\Delta CR_n$ for each product group of a predetermined number of semiconductor integrated circuit device chips, leaving delay test frequency candidates having larger values of ΔCR, adding a news delay teat frequency candidate, and carrying out the processes S1 through S9 are repeated, and the delay test frequency having larger ΔCR is found out.

It is noted that a specific example of how to determine the above-mentioned n−1 delay test frequency candidates and how to determine a new delay test frequency candidate will be described later.

Thus, a frequency as a new delay test frequency candidate is determined to be added for carrying out the delay test of the same contents (i.e., the factors in the delay test other than the delay test frequency are the same) with n delay test frequencies that are different each time on each product of a product group of semiconductor integrated circuit device bare chips. For this purpose, data of the number of delay test frequencies, "cost increase" and "cost decrease" are obtained, and are registered in a form of a database.

Then, based on the registered data, such a new delay test frequency candidate is obtained that ΔCR increases.

Below, a specific example thereof will be described.

First, it is assumed that:

a predetermined operating frequency of a product (i.e., an after packaging operation delay verification frequency) is A;

a current delay test frequency 1 is $B_1$;

a current delay test frequency 2 is $B_2$;

.
.
.

a current delay test frequency n is $B_n$.

There, $A > B_1$, and $B_1 < B_2 < \ldots < B_n < A$.

As the first current delay test frequency 1, $B_1$, a value that is approximately 80% of the predetermined operating frequency A is determined. That is:

$B \approx A \times 0.8$

Further, an increment of $B_i$ from $B_{i-1}$, i.e., an interval between $B_{i-1}$ and $B_i$ is determined as a value obtained from dividing a difference between $B_1$ and A by approximately 10. That is:

$B_{i+1} - B_i \approx (A - B_1) \div 10$

Further, the above-mentioned "cost increase" and "cost decrease" at the current delay test frequency 1 through n ($B_1$ through $B_n$) are defined as follows:

"cost increase" at the current delay test frequency 1 ($B_1$) is $z_1$;

"cost increase" at the current delay test frequency 2 ($B_2$) is $z_2$;

.
.
.

"cost increase" at the current delay test frequency n ($B_n$) is $z_n$;

"cost decrease" at the current delay test frequency 1 ($B_1$) is $g_1$;

"cost decrease" at the current delay test frequency 2 ($B_2$) is $g_2$;

.
.
.

"cost decrease" at the current delay test frequency n ($B_n$) is $g_n$;

At this time, the bare chip operation delay verification reduction amount ΔCR is calculated as follows:

ΔCR at current delay test frequency 1 ($B_1$)=$g_1 - z_1$;

ΔCR at current delay test frequency 2 ($B_2$)=$g_2 - z_2$;

.
.
.

ΔCR at current delay test frequency n ($B_n$)=$g_n - z_n$.

The above-mentioned new delay test frequency candidate is determined as follows:

In a case where $$g_1-z_1 \leq g_2-z_2 \leq \ldots \leq g_n-z_n$$

that is, in a case where $\Delta CR$ monotonously increases as the delay test frequency increases, the new delay test frequency candidate is calculated by $B+(A-B_n)/2$.

That is, the new delay test frequency candidate is obtained as a value obtained from adding, to the maximum current delay test frequency $B_n$, ½ of a value obtained from subtracting $B_n$ from the after packaging operation delay verification frequency A.

On the other hand, in a case where the following relationship does not hold:

$$g_1-z_1 \leq g_2-z_2 \leq \ldots \leq g_n-z_n$$

that is, in a case where $\Delta CR$ does not monotonously increase as the delay test frequency increases, the above-mentioned flow of operations of determining the new delay test frequency candidate to be added and obtain n delay test frequency candidates, carrying out the processes S1 through S9 on a new product group of bare chips at the n delay test frequency candidates, and obtaining respective $\Delta CR$ are stopped. Then, the delay test frequency candidate corresponding to the largest $\Delta CR$ of $\Delta CR_1, \Delta CR_2, \ldots, \Delta CR_n$, i.e., $g_1-z_1, g_2-z_2, \ldots, g_n-z_n$, until then is obtained, as a final "bare chip operation delay verification frequency such that the bare chip operation delay verification reduction amount ($\Delta CR$) is expected to be maximized".

Below, a numerical example will be described.

In a case where A=2.0 [GHz], first, $B_1$=1.6 [GHz] is determined. That is, 2.0×0.8=1.6

Next, $B_2$=1.64 [GHz], $B_3$=1.68 [GHz], $B_4$=1.72 [GHz] are determined in sequence. That is, (2−1.6)/10=0.04

1.6+0.04=1.64

1.64+0.04=1.68

1.68+0.04=1.72

Then, it is assumed that, for $B_1$, $B_2$, $B_3$, $B_4$, the following $\Delta CR$ is obtained:

$\Delta CR_1 = g_1 - z_1 = 50-38 = 12$ $\Delta CR_2 = g_2 - z_2 = 53-36 = 17$ $\Delta CR_3 = g_3 - z_3 = 56-34 = 22$ $\Delta CR_4 = g_4 - z_4 = 54-36 = 18$ Since $\Delta CR_3 = g_3 - z_3 = 22$ is the largest among $\Delta CR_1$ through $\Delta CR_4$, corresponding $B_3$=1.68 [GHz] is determined as the final "bare chip operation delay verification frequency such that the bare chip operation delay verification reduction amount ($\Delta CR$) is expected to be maximized".

Below, with reference to figures, a configuration of the semiconductor integrated circuit device bare chip operation delay verification frequency determining method according to the embodiment of the present invention described above will be described.

FIG. 5 illustrates a principle of obtaining an optimum value of the delay test frequency used in the delay test in a case where screening is carried out by using the delay test on a semiconductor integrated circuit device bare chip before packaging (in a bare chip state).

In FIG. 5, a curve "cost increase" depicts a change of total costs of the top and middle fields of FIG. 4, i.e., "bare chip operation delay verification"

$$\sum_{i=A,B,C,D} N_i \cdot DTC$$

and $N_C \cdot UP$ ("over-kill loss"), with respect to the delay test frequency (in FIG. 5, "operating frequency") used in the delay test. A curve "cost decrease" in FIG. 5 depicts a change of the costs of the bottom field of FIG. 4, i.e., "costs of processes starting from packaging of defective products" $N_D \cdot (PC+STC)$, with respect to the delay test frequency (in FIG. 5, "operating frequency") used in the delay test.

As depicted in FIG. 5, as the delay test frequency increases, "cost increase" amount increases. In contrast thereto, "cost decrease" amount first increases as the delay test frequency increases, but has a local maximum value when approaching "product shipment frequency", i.e., "after packaging operation delay verification frequency", and then, decreases.

As a result, as can be seen from FIG. 5, a value of $\Delta CR$ (="cost decrease"−"cost increase") has a positive value after "break-even point for carrying out delay test" in FIG. 5, has a "maximum" value ("optimum delay test frequency" in FIG. 5) before "product shipment frequency", decreases after that, and has a negative value after passing "product shipment frequency".

That is, it can be said that, "optimum delay test frequency" in FIG. 5 is an optimum delay test frequency at which $\Delta CR$ becomes maximum.

According to the semiconductor integrated circuit device bare chip operation delay verification frequency determining method in the embodiment of the present invention, a value closer to the optimum delay test frequency is obtained, thus $\Delta CR$ becomes larger, and thereby, the costs required for the semiconductor integrated circuit device manufacturing processes S1 through S9 described above with reference to FIG. 1 are effectively reduced.

Figure 6:
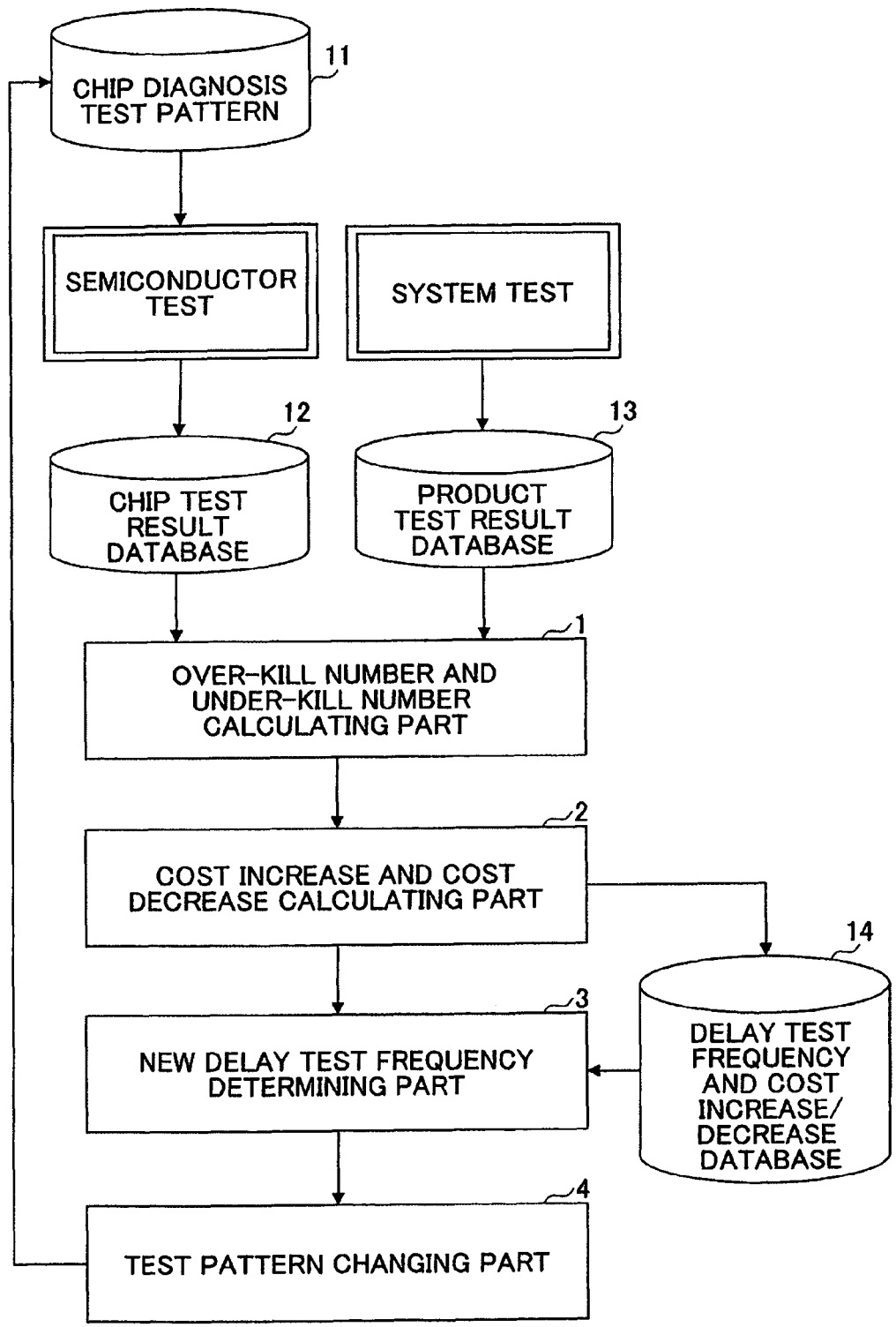
FIG. 6 depicts a system configuration illustrating the semiconductor integrated circuit device bare chip operation delay verification frequency determining method in one embodiment of the present invention.

FIG. 6 is a functional block diagram illustrating a configuration of a program for causing a computer to carry out the semiconductor integrated circuit device bare chip operation delay verification frequency determining method in the embodiment of the present invention.

As depicted in FIG. 6, the program for causing a computer to carry out the semiconductor integrated circuit device bare chip operation delay verification frequency determining method in the embodiment of the present invention includes an over-kill number and under-kill number calculating part 1, a cost increase and cost decrease calculating part 2, a new delay test frequency determining part 3 and a test pattern changing part 4.

The over-kill number and under-kill number calculating part 1 obtains the above-mentioned over-kill number $N_C$ and under-kill number $N_B$ based on stored contents of a database 12 and stored contents of a database 13. The database 12 stores results of the delay tests obtained from inputting predetermined chip diagnosis test patterns 11 to semiconductor integrated circuit device bare chips in the delay defect screening process S3 of the above-described semiconductor integrated circuit device manufacturing processes S1 through S9 described above with reference to FIG. 1. In other words, the database 12 stores a result of whether the semiconductor integrated circuit device bare chips are defective for delay before packaging. The database 13 stores results of whether semiconductor integrated circuit device chips are defective for delay in the system test after packaging, i.e., the running test S9 described above with reference to FIG. 1.

That is, the over-kill number $N_C$ is a number of products of semiconductor integrated circuit device chips that are judged as defective for delay in the delay test before packaging, but are judged as non-defective for delay in the product test (i.e., running test process S9) after packaging. The under-kill number $N_B$ is a number of products of semiconductor integrated circuit device chips that are judged as non-defective for delay in the delay test before packaging, but are judged as defective for delay in the product test (i.e., running test process S9) after packaging.

It is noted that, the delay test has the contents such as those described above with reference to FIGS. 2A and 2B, and the above-mentioned chip diagnosis test pattern 11 includes clock pulses and test vectors depicted in FIG. 2A.

The cost increase and cost decrease calculating part 2 calculates the respective values of "cost increase" and "cost decrease" according to the formula (1) described above with reference to FIG. 4 and the following formulas (2) and (3), based on data including the thus-obtained over-kill number $N_C$ and under-kill number $N_B$.

$$\text{COST INCREASE} = N_C \cdot UP + \sum_{i=A,B,C,D} N_i \cdot DTC \quad (2)$$

$$\text{COST DECREASE} = N_D \cdot (PC + STC) \quad (3)$$

The thus-obtained respective values of "cost increase" and "cost decrease" are stored in a database 14.

The new delay test frequency determining part 3 determines the above-mentioned new delay test frequency candidate based on the thus-obtained respective values of "cost increase" and "cost decrease" obtained for each of delay test frequency candidates, according to a method such as that described above as in the specific example. This case is a case where a tendency of ΔCR is such that ΔCR monotonously increases, as mentioned above, for example. Or, the current processing is finished in a case where a final "bare chip operation delay verification frequency such that the bare chip operation delay verification reduction amount (ΔCR) is expected to be maximized" is determined at this time as mentioned above in the specific example. This case is a case where a tendency of ΔCR is such that ΔCR does not monotonously increase, as mentioned above, for example.

When the new delay test frequency determining part 3 has thus determined the new delay test frequency, the test pattern changing part 4 obtains n delay test frequency candidates as a result of adding the new delay test frequency and removing the delay test frequency candidate at which ΔCR becomes smallest.

Then, for the thus-obtained n delay test frequency candidates, the test pattern changing part 4 changes the test pattern for the purpose of removing a factor of over-kill such as the case C by removing, from paths tested according to the test pattern, a path for which it is not possible to test in view of a function, i.e., for a microprocessor, removing a path that is not activated from any command strings, or for which it is not possible to observe a fault from an observation point.

Further, the test pattern changing part 4 uses the thus-changed test pattern as the test pattern 11 for a product group of a next predetermined number of semiconductor integrated circuit device bare chips.

Figure 7:
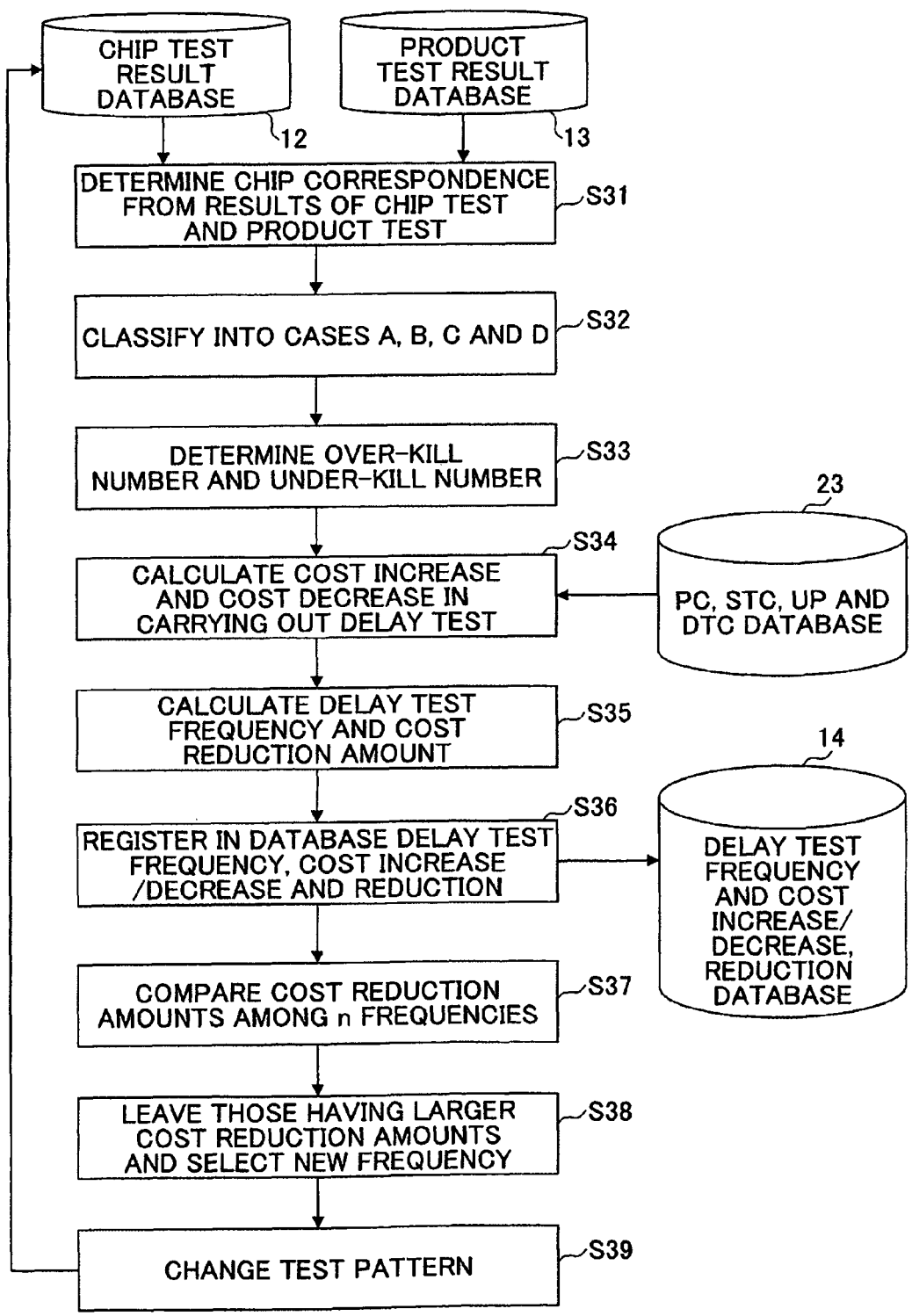
FIG. 7 depicts a processing flowchart illustrating a flow of processing in the semiconductor integrated circuit device bare chip operation delay verification frequency determining method in one embodiment of the present invention.

FIG. 7 is a flowchart illustrating a flow of processing in the semiconductor integrated circuit device bare chip operation delay verification frequency determining method in the embodiment of the present invention.

In FIG. 7, in steps S31 and S32, it is determined which one of the cases A, B, C and D described above with reference to FIG. 3, each product of a product group of a predetermined number of semiconductor integrated circuit device chips belongs to, by comparing between the stored data of the database 12 and the stored data of the database 13 for whether a delay defect exists, for the respective products of the semiconductor integrated circuit device chips, for the respective delay test frequency candidates used in the delay test of the delay defect screening process S3.

The stored data of the database 12 is data indicating results of the delay test of the delay defect screening process S3 of the semiconductor integrated circuit device manufacturing process S1 through S9 described above with reference to FIG. 1 carried out on the product group of the predetermined number of semiconductor integrated circuit device chips. That is, the stored data of the database 12 is data indicating whether each product of the product group of semiconductor integrated circuit device chips has been judged as being defective for delay in the delay test of the delay defect screening process S3, for each delay test frequency candidate. The stored data of the database 13 is data indicating whether the same product of the product group of semiconductor integrated circuit device chips has been judged as being defective for delay in the product test of the running test process S9 for the same delay test frequency candidate.

Then, from the thus-obtained results, the number of products belonging to the above-mentioned over-kill number $N_C$, i.e., the number of products belonging to the case C, and the number of products belonging to the above-mentioned under-kill number $N_B$, i.e., the number of products belonging to the case B, are obtained (step S33).

Next, in step S34, from the above-mentioned formulas (2) and (3), the respective values of "cost increase" and "cost decrease" are calculated.

The respective values of the above-mentioned parameters PC, STC, UP and DTC are previously stored in a database 23.

In step S35, from the thus-obtained respective values of "cost increase" and "cost decrease", the above-mentioned formula (1) is calculated, i.e., the value ΔCR obtained from subtracting the value of "cost increase" from the value of "cost decrease" is calculated, for each of the delay test candidates.

In step S36, the thus-obtained respective values, i.e., "cost increase", "cost decrease" and ΔCR, for each of the delay test frequency candidates, are registered in the database 14.

In step S37, based on the data thus registered in the database 14, a tendency (whether ΔCR monotonously increase) of ΔCR is obtained as in the above-mentioned specific example. In a case where the optimum delay test frequency is thus obtained, the current processing is finished. This case is a case where a final "bare chip operation delay verification frequency such that the bare chip operation delay verification reduction amount (ΔCR) is expected to be maximized" is determined at this time as mentioned above in the specific example. This case is a case where a tendency of ΔCR is such that ΔCR does not monotonously increase, as mentioned above, for example. Otherwise, the delay test frequency candidate at which ΔCR is smallest is removed from the delay test frequency candidates, the others of the delay test frequency candidates are remained, and the new delay test frequency candidate is determined, in step S38, as mentioned above in the specific example. This case is a case where a tendency of ΔCR is such that ΔCR monotonously increases, as mentioned above, for example.

In step S39, the test pattern which is used at each of the delay test frequency candidates obtained in step S38 is changed.

That is, in step S39, for the delay test frequency candidates, for the purpose of removing a factor of over-kill such as the case C, a path for which it is not possible to test in view of a function, i.e., for a microprocessor, a path that is not activated from any command strings, or for which it is not possible to observe a fault from an observation point, is removed from paths that are tested according to the test pattern.

The thus-changed test pattern is used for a product group of a new predetermined number of semiconductor integrated circuit device bare chips.

That is, according to the semiconductor integrated circuit device bare chip operation delay verification frequency determining method in the embodiment of the present invention, the manufacturing processes S1 through S9 described above with reference to FIG. 1 are carried out on each product of a product group of a predetermined number of semiconductor integrated circuit device bare chips having the same specification. At this time, in the delay test in the delay defect screening process S3, the delay test is carried out, for each product, at each of delay test frequency candidates $f_1$ through $f_n$ (i.e., $B_1$ through $B_n$ in the above-mentioned specific example, for example). The thus-obtained results of the delay test, and results of the product test in the running test process S9 are stored in the databases 12 and 13. Then, based on the stored data of the databases 12 and 13, the above-mentioned steps S31 through S39 of FIG. 7 are carried out.

Then, the above-mentioned steps S1 through S9 of FIG. 1 and steps S31 through S39 of FIG. 7 are repeated for a product group of a predetermined number of semiconductor integrated circuit device bare chips (that are new each time), until the optimum delay test frequency, that is, until the above-mentioned final "bare chip operation delay verification frequency such that the bare chip operation delay verification reduction amount ($\Delta CR$) is expected to be maximized" is obtained.

During the processing, any products that are judged as defective for delay in the delay defect screening process S3 are not discarded, and the steps S4 through S9 are carried out thereon. This is because, until the optimum delay test frequency is obtained in step S37, $\Delta CR$ are obtained for all the products. For this purpose, the over-kill number $N_C$ is obtained. Therefore, in the delay defect screening process S3, actual screening is not carried out, and the subsequent processes S5 through S9 are carried out also on products that are judged as defective for delay in the delay test of the delay defect screening process S3. Further, in this case, the above-mentioned products that are judged as defective for delay in the delay test of the delay defect screening process S3 may be judged as non-defective in the product test of the running test S9, and thus, may be shipped.

Figure 8:
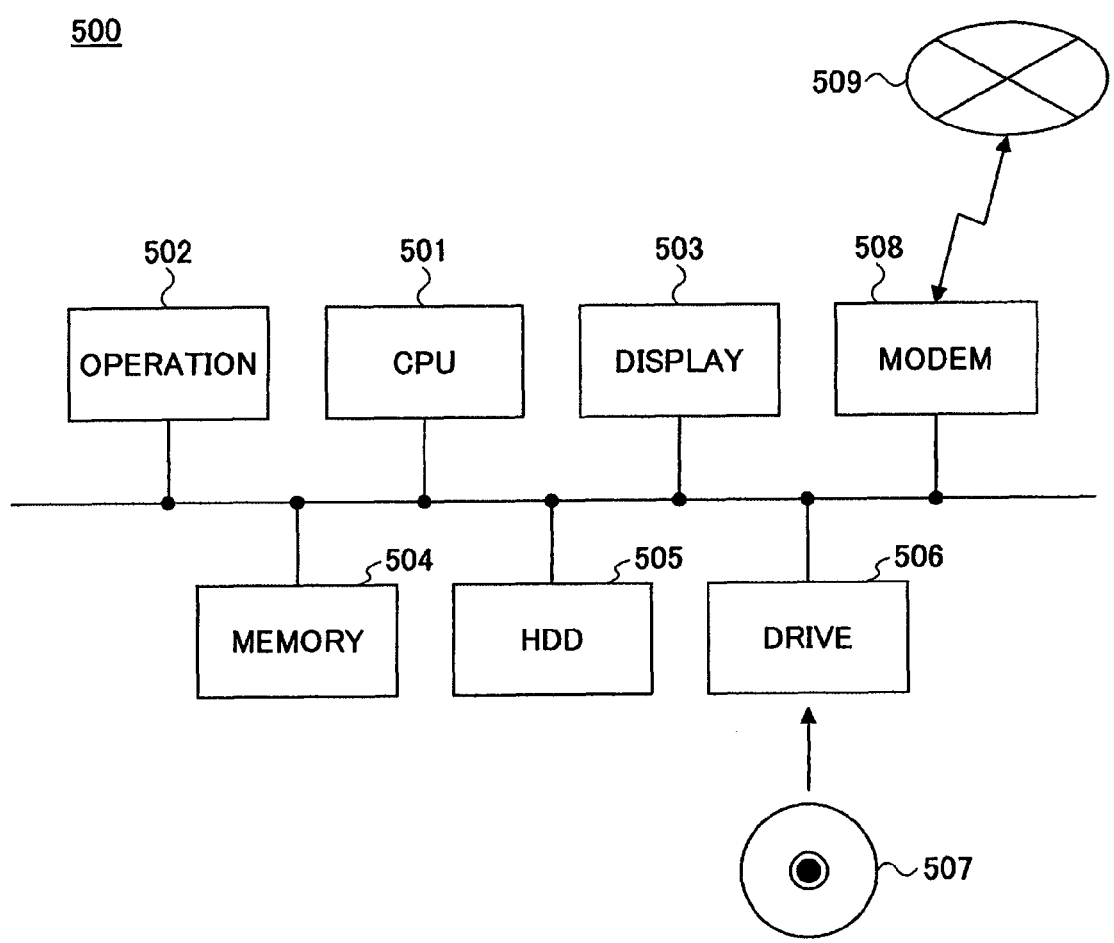
FIG. 8 depicts a hardware configuration of a computer for illustrating one example of realizing the semiconductor integrated circuit device bare chip operation delay verification frequency determining method in one embodiment of the present invention by using the computer.

FIG. 8 depicts a block diagram of one example of a computer for illustrating a case where the above-mentioned semiconductor integrated circuit device bare chip operation delay verification frequency determining method in the embodiment of the present invention is carried out by the computer.

As depicted in FIG. 8, the computer 500 includes a CPU 501 that carries out various operations by executing instructions included in a given program; an operation part 502 that includes a keyboard, a mouse and so forth, and is used by a user to input operating contents or data; a display part 503 that includes a CRT, a liquid crystal display device or such, displaying a state or a result of a process carried out by the CPU 501, or such; a memory 504 that includes a ROM, a RAM and so forth, storing a program executed by the CPU 501, data and so forth used by the CPU 501, or used as a working are by the CPU 501; a hard disk drive 505 that stores a program, data and so forth; a CD-ROM drive 506 for externally loading a program or data by using a CD-ROM 507 as a computer-readable information recording medium; and a modem 508 for externally downloading a program or data by using a communication network 509 such as the Internet, a LAN or such.

The computer 500 uses the CD-ROM 507 as the computer-readable information recording medium or by using the communication network 509, and loads or downloads a program that is configured to cause the computer 500 to carry out the above-described semiconductor integrated circuit device bare chip operation delay verification frequency determining method in the embodiment of the present invention. Then, in the computer 500, the program is installed in the hard disk drive 505, is loaded the program in the memory 504 from the hard disk drive 505, and is executed by the CPU 501. As a result, the above-described semiconductor integrated circuit device bare chip operation delay verification frequency determining method in the embodiment of the present invention is carried out.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that various changes, substitutions, and alterations could be made hereto without departing from the sprit and scope of the invention.

What is claimed is:

1. An operating frequency determining apparatus comprising:
    an elemental semiconductor diagnosis test pattern input part, to which an elemental semiconductor diagnosis test pattern for an elemental semiconductor integrated circuit is input;
    an elemental semiconductor test result input part, to which a result of an elemental semiconductor test performed on the elemental semiconductor integrated circuit device at an operating frequency by using the elemental semiconductor diagnosis test pattern is input;
    a semiconductor device test result input part, to which a result of a semiconductor device test performed on a semiconductor integrated circuit device obtained from packaging the elemental semiconductor integrated circuit at an operating frequency by using a semiconductor device diagnosis test pattern;
    an excessive discarding number/short discarding number calculating part configured to calculate an excessive discarding number of elemental semiconductor integrated circuits for which a negative result is obtained from the elemental semiconductor test but a positive result is obtained from the semiconductor device test, and calculate a short discarding number of elemental semiconductor integrated circuits for which a positive result is obtained from the elemental semiconductor test but a negative result is obtained from the semiconductor device test;
    a manufacturing total cost variation calculating part configured to calculate, by using the excessive discarding number and the short discarding number, a variation in manufacturing total costs of the semiconductor integrated circuit device, by using an excessive loss amount caused by unnecessarily discarding elemental semiconductor integrated circuits occurring as a result of a negative result being obtained in the elemental semiconductor test but a positive result being obtained from the semiconductor device test, and using a short loss amount caused by packaging elemental semiconductor integrated circuits for semiconductor integrated circuit devices that are discarded as a result of a positive result being obtained from the elemental semiconductor test but a negative result being obtained from the semiconductor device test;

an operating frequency/manufacturing total cost variation input part, to which the variation in manufacturing total costs with respect to the operating frequency is input; and an operating frequency determining part configured to determine a new operating frequency to be used in the elemental semiconductor test or the semiconductor device test, by using the variation in manufacturing total costs with respect to the operating frequency input to the operating frequency/manufacturing total cost variation input part.

2. The operating frequency determining apparatus as claimed in claim 1, wherein:
the operating frequency determining part determines an optimum new operating frequency to be used in the elemental semiconductor test or the semiconductor device test, by determining plural times the new operating frequency.

3. The operating frequency determining apparatus as claimed in claim 1, wherein:
the operating frequency used for carrying out the elemental semiconductor test by using the elemental semiconductor diagnosis test pattern on the elemental semiconductor integrated circuit is different from the operating frequency used for carrying out the semiconductor device test by using the semiconductor device diagnosis test pattern on a semiconductor integrated circuit device obtained from packaging the elemental semiconductor integrated circuit, and
the operating frequency determining part determines a new operating frequency used for the elemental semiconductor test and a new operating frequency used for the semiconductor device test separately.

4. The operating frequency determining apparatus as claimed in claim 1, further comprising:
a test pattern changing part configured to change the elemental semiconductor diagnosis test pattern and the semiconductor device diagnosis test pattern by using the information concerning a variation in manufacturing total costs with respect to the first and second operating frequencies input to the operating frequency/manufacturing total cost variation input part.

5. The operating frequency determining apparatus as claimed in claim 1, wherein:
the operating frequency determining part selects, from variations in manufacturing total costs for the elemental semiconductor test and the semiconductor device test carried out at respective ones of n (where n denotes a positive integer) operating frequencies, variations in manufacturing total costs for the elemental semiconductor test and the semiconductor device test carried out at respective ones of n−1 operating frequencies for which n−1 operating frequencies reduction amounts in the manufacturing total costs are larger, and further determines new operating frequencies to be used for the elemental semiconductor test and the semiconductor device test, by using information concerning variations in manufacturing total costs obtained from adding a variation in manufacturing total costs for the elemental semiconductor test and the semiconductor device test carried out at an operating frequency different from the n operating frequencies, to the variations in manufacturing total costs for the elemental semiconductor test and the semiconductor device test carried out at respective ones of the n−1 operating frequencies.

6. The operating frequency determining apparatus as claimed in claim 1, wherein:
the operating frequency determining part obtains a reduction amount of manufacturing total costs by the following formula:

$$\Delta CR = N_D \cdot (PC + STC) - N_C \cdot UP - \sum_{i=A,B,C,D} N_i \cdot DTC \quad (1)$$

where:
$N_A$ denotes the number of elemental semiconductor integrated circuits, of m (where m denotes a positive integer) elemental semiconductor integrated circuits, for which a positive result is obtained from the elemental semiconductor test and also a positive result is obtained from the semiconductor device test,
$N_B$ denotes the number of elemental semiconductor integrated circuits, of the m elemental semiconductor integrated circuits, for which a positive result is obtained from the elemental semiconductor test but a negative result is obtained from the semiconductor device test,
$N_C$ denotes the number of elemental semiconductor integrated circuits, of the m elemental semiconductor integrated circuits, for which a negative result is obtained from the elemental semiconductor test but a positive result is obtained from the semiconductor device test,
$N_D$ denotes the number of elemental semiconductor integrated circuits, of the m elemental semiconductor integrated circuits, for which a negative result is obtained from the elemental semiconductor test and also a negative result is obtained from the semiconductor device test,
UP denotes a unit price of the elemental semiconductor integrated circuits,
PC denotes costs required for packaging each one of the elemental semiconductor integrated circuits,
STC denotes system test costs required for carrying out a system test before the semiconductor device test after packaging the elemental semiconductor integrated circuits,
DTC denotes costs required for the elemental semiconductor test carried out on each of the elemental semiconductor integrated circuits, and
it is required that the reduction amount $\Delta CR$ is larger than 0.

7. An operating frequency determining method comprising:
inputting an elemental semiconductor diagnosis test pattern for an elemental semiconductor integrated circuit;
inputting a result of an elemental semiconductor test performed on the elemental semiconductor integrated circuit device at an operating frequency by using the elemental semiconductor diagnosis test pattern;
inputting a result of a semiconductor device test performed on a semiconductor integrated circuit device obtained from packaging the elemental semiconductor integrated circuit at an operating frequency being carried out by using a semiconductor device diagnosis test pattern;

calculating an excessive discarding number of elemental semiconductor integrated circuits for which a negative result is obtained from the elemental semiconductor test but a positive result is obtained from the semiconductor device test, and calculating a short discarding number of elemental semiconductor integrated circuits for which a positive result is obtained from the elemental semiconductor test but a negative result is obtained from the semiconductor device test;

calculating, by using the excessive discarding number and the short discarding number, a variation in manufacturing total costs of the semiconductor integrated circuit device, by using an excessive loss amount caused by unnecessarily discarding elemental semiconductor integrated circuits occurring as a result of a negative result being obtained from the elemental semiconductor test although a positive result being obtained from the semiconductor device test, and using a short loss amount caused by packaging elemental semiconductor integrated circuits for semiconductor integrated circuit devices that are to be discarded as a result of although a positive result being obtained from the elemental semiconductor test, a negative result being obtained from the semiconductor device test;

inputting the variation in manufacturing total costs with respect to the operating frequency; and determining a new operating frequency to be used in the elemental semiconductor test or the semiconductor device test, by using the input variation in manufacturing total costs with respect to the operating frequency.

8. The operating frequency determining method as claimed in claim 7, wherein:

the determining a new operating frequency determines an optimum new operating frequency to be used in the elemental semiconductor test or the semiconductor device test, by determining plural times the new operating frequency.

9. The operating frequency determining method as claimed in claim 7, wherein:

the operating frequency used for carrying out the elemental semiconductor test by using the elemental semiconductor diagnosis test pattern on the elemental semiconductor integrated circuit is different from the operating frequency used for carrying out the semiconductor device test by using the semiconductor device diagnosis test pattern on the semiconductor integrated circuit device obtained from packaging the elemental semiconductor integrated circuit, and the determining a new operating frequency determines a new operating frequency used for the elemental semiconductor test and a new operating frequency used for the semiconductor device test separately.

10. The operating frequency determining method as claimed in claim 7, further comprising:

changing the elemental semiconductor diagnosis test pattern and the semiconductor device diagnosis test pattern by using the input variation in manufacturing total costs with respect to the first and second operating frequencies.

11. The operating frequency determining method as claimed in claim 7, wherein:

the determining a new operating frequency selects, from variations in manufacturing total costs for the elemental semiconductor test and the semiconductor device test carried out at respective ones of n (where n denotes a positive integer) operating frequencies, variations in manufacturing total costs for the elemental semiconductor test and the semiconductor device test carried out at respective ones of n−1 operating frequencies for which n−1 operating frequencies reduction amounts in the manufacturing total costs are larger, and further determines new operating frequencies to be used for the elemental semiconductor test and the semiconductor device test, by using variations in manufacturing total costs obtained from adding a variation in manufacturing total costs for the elemental semiconductor test and the semiconductor device test carried out at an operating frequency different from the n operating frequencies, to the variations in manufacturing total costs for the elemental semiconductor test and the semiconductor device test carried out at respective ones of the n−1 operating frequencies.

12. The operating frequency determining method as claimed in claim 7, wherein:

the determining a new operating frequency obtains a reduction amount of manufacturing total costs by the following formula:

$$\Delta CR = N_D \cdot (PC + STC) - N_C \cdot UP - \sum_{i=A,B,C,D} N_i \cdot DTC \quad (1)$$

where:

$N_A$ denotes the number of elemental semiconductor integrated circuits, of m (where m denotes a positive integer) elemental semiconductor integrated circuits, for which a positive result is obtained from the elemental semiconductor test and also a positive result is obtained from the semiconductor device test, $N_B$ denotes the number of elemental semiconductor integrated circuits, of the m elemental semiconductor integrated circuits, for which a positive result is obtained from the elemental semiconductor test but a negative result is obtained from the semiconductor device test, $N_C$ denotes the number of elemental semiconductor integrated circuits, of the m elemental semiconductor integrated circuits, for which a negative result is obtained from the elemental semiconductor test but a positive result is obtained from the semiconductor device test, $N_D$ denotes the number of elemental semiconductor integrated circuits, of the m elemental semiconductor integrated circuits, for which a negative result is obtained from the elemental semiconductor test and also a negative result is obtained from the semiconductor device test, UP denotes a unit price of the elemental semiconductor integrated circuits, PC denotes costs required for packaging each one of the elemental semiconductor integrated circuits, STC denotes system test costs required for carrying out a system test before the semiconductor device test after packaging the elemental semiconductor integrated circuits, DTC denotes costs required for the elemental semiconductor test carried out on each of the elemental semiconductor integrated circuits, and it is required that the reduction amount $\Delta CR$ is larger than 0.

13. A computer-readable information recording medium storing a program which, when executed by a computer processor, performs:

inputting an elemental semiconductor diagnosis test pattern for an elemental semiconductor integrated circuit;

inputting a result of an elemental semiconductor test performed on the elemental semiconductor integrated circuit device at an operating frequency by using the elemental semiconductor diagnosis test pattern;

inputting a result of a semiconductor device test performed on a semiconductor integrated circuit device obtained from packaging the elemental semiconductor integrated circuit at an operating frequency being carried out by using a semiconductor device diagnosis test pattern;

calculating an excessive discarding number of elemental semiconductor integrated circuits for which a negative result is obtained from the elemental semiconductor test but a positive result is obtained from the semiconductor device test, and calculating a short discarding number of elemental semiconductor integrated circuits for which a positive result is obtained from the elemental semiconductor test but a negative result is obtained from the semiconductor device test;

calculating, by using the excessive discarding number and the short discarding number, a variation in manufacturing total costs of the semiconductor integrated circuit device, by using an excessive loss amount caused by unnecessarily discarding elemental semiconductor integrated circuits occurring as a result of a negative result being obtained from the elemental semiconductor test although a positive result being obtained from the semiconductor device test, and using a short loss amount caused by packaging elemental semiconductor integrated circuits for semiconductor integrated circuit devices that are to be discarded as a result of although a positive result being obtained from the elemental semiconductor test, a negative result being obtained from the semiconductor device test;

inputting the variation in manufacturing total costs with respect to the operating frequency; and determining a new operating frequency to be used in the elemental semiconductor test or the semiconductor device test, by using the input variation in manufacturing total costs with respect to the operating frequency.

14. The computer-readable information recording medium as claimed in claim 13, wherein:

the determining a new operating frequency determines an optimum new operating frequency to be used in the elemental semiconductor test or the semiconductor device test, by determining plural times the new operating frequency.

15. The computer-readable information recording medium as claimed in claim 13, wherein:

the operating frequency used for carrying out the elemental semiconductor test by using the elemental semiconductor diagnosis test pattern on the elemental semiconductor integrated circuit is different from the operating frequency used for carrying out the semiconductor device test by using the semiconductor device diagnosis test pattern on the semiconductor integrated circuit device obtained from packaging the elemental semiconductor integrated circuit, and the determining a new operating frequency determines a new operating frequency used for the elemental semiconductor test and a new operating frequency used for the semiconductor device test separately.

16. The computer-readable information recording medium as claimed in claim 13, storing the program which, when executed by a computer processor, further performs:

changing the elemental semiconductor diagnosis test pattern and the semiconductor device diagnosis test pattern by using the input variation in manufacturing total costs with respect to the first and second operating frequencies.

17. The computer-readable information recording medium as claimed in claim 13, wherein:

the determining a new operating frequency selects, from variations in manufacturing total costs for the elemental semiconductor test and the semiconductor device test carried out at respective ones of n (where n denotes a positive integer) operating frequencies, variations in manufacturing total costs for the elemental semiconductor test and the semiconductor device test carried out at respective ones of n−1 operating frequencies for which n−1 operating frequencies reduction amounts in the manufacturing total costs are larger, and further determines new operating frequencies to be used for the elemental semiconductor test and the semiconductor device test, by using variations in manufacturing total costs obtained from adding a variation in manufacturing total costs for the elemental semiconductor test and the semiconductor device test carried out at an operating frequency different from the n operating frequencies, to the variations in manufacturing total costs for the elemental semiconductor test and the semiconductor device test carried out at respective ones of the n−1 operating frequencies.

18. The computer-readable information recording medium as claimed in claim 13, wherein:

the determining a new operating frequency obtains a reduction amount of manufacturing total costs by the following formula:

$$\Delta CR = N_D \cdot (PC + STC) - N_C \cdot UP - \sum_{i=A,B,C,D} N_i \cdot DTC \quad (1)$$

where:

$N_A$ denotes the number of elemental semiconductor integrated circuits, of m (where m denotes a positive integer) elemental semiconductor integrated circuits, for which a positive result is obtained from the elemental semiconductor test and also a positive result is obtained from the semiconductor device test, $N_B$ denotes the number of elemental semiconductor integrated circuits, of the m elemental semiconductor integrated circuits, for which a positive result is obtained from the elemental semiconductor test but a negative result is obtained from the semiconductor device test, $N_C$ denotes the number of elemental semiconductor integrated circuits, of the m elemental semiconductor integrated circuits, for which a negative result is obtained from the elemental semiconductor test but a positive result is obtained from the semiconductor device test, $N_D$ denotes the number of elemental semiconductor integrated circuits, of the m elemental semiconductor integrated circuits, for which a negative result is obtained from the elemental semiconductor test and also a negative result is obtained from the semiconductor device test, UP denotes a unit price of the elemental semiconductor integrated circuits, PC denotes costs required for packaging each one of the elemental semiconductor integrated circuits, STC denotes system test costs required for carrying out a system test before the semiconductor device test after packaging the elemental semiconductor integrated circuits, DTC denotes costs required for the elemental semiconductor test carried out on each of the elemental semiconductor integrated circuits, and it is required that the reduction amount $\Delta CR$ is larger than 0.

* * * * *